Sept. 23, 1969 R. MAIER 3,468,021

METHOD FOR MANUFACTURING SUPERCONDUCTIVE CONDUCTORS

Filed April 21, 1966 2 Sheets-Sheet 1

METHOD FOR MANUFACTURING SUPERCONDUCTIVE CONDUCTORS

United States Patent Office 3,468,021
Patented Sept. 23, 1969

3,468,021
METHOD FOR MANUFACTURING SUPERCONDUCTIVE CONDUCTORS

Richard Maier, Erlangen, Germany, assignor to Siemens Aktiengesellschaft, Erlangen, Germany, a corporation of Germany Filed Apr. 21, 1966, Ser. No. 544,130
Claims priority, application Germany, May 10, 1965, S 97,015
Int. Cl. B23k *31/02*; B23p *25/00*
U.S. Cl. 29—599 7 Claims

ABSTRACT OF THE DISCLOSURE

A method of manufacturing superconductive bands which have layers of a superconductive intermetallic compound of niobium-tin. A pair of niobium bands of tin with a layer of tin situated therebetween is heated to a temperature between approximately 950° to 1200° C. to place the tin in molten condition while maintaining a distance of from 5 to 10$\mu$ between the niobium bands so that the molten tin does not flow out of the space between the niobium bands while at the same time reacting with and diffusing into the niobium bands to form layers of niobium-tin therewith.

My invention relates to superconductive structures of a filamentary nature, such as superconductive wires and bands.

Wires and band which can be rendered superconducting find many uses in electrotechnical areas, since the ohmic resistance thereof disappears completely when such wires or bands are in the superconducting state. Thus, for example, certain advantages are to be expected when using superconductors for the transmission of electrical current or for the manufacture of coils for achieving intense magnetic fields.

Superconductors which are intended for use in the achieving of strong magnetic fields must have a high critical magnetic field, which is to say, the transition from the superconducting to the normal conducting state should not take place until a very intense magnetic field is achieved. A known superconductive material which has an extremely high critical magnetic field is the two-component intermetallic compound of noibium-tin ($Nb_3Sn$). This compound has at approximately 4° K. a critical magnetic field of over 200 kilogauss. There are at the present time several known methods for manufacturing superconductive wires and bands using niobium-tin as the superconductive material.

According to one method a niobium tube is filled with a mixture of niobium and tin powder and is then drawn into a wire. After the wire has been brought into its final form, in which it is coiled into a spool, for example, it is annealed and the niobium and the tin diffuse one into the other in the interior of the wire thus achieving a cohesive superconductive layer (J. E. Kunzler, Review of Modern Physics, 33 (1961), 501).

According to another method superconductive outer surfaces are achieved by diffusing tin into niobium bands or wires. The bands or wires are immersed in a molten tin bath for this purpose, or they are placed over the molten tin in the hot vaporized atmosphere situated thereover. Also, a layer of tin can be applied to the niobium wire or band material in a cold condition and subsequently annealed. (E. Sauer and J. Wurm, Naturwissenschaften, 49 (1962), 127.)

According to a further method, a $Nb_3Sn$ layer is separated onto a metallic wire or band carrier by reduction of a gaseous chloride of niobium and tin. (French Patent 1,322,777.)

The above methods and the wires and bands manufactured thereby have several disadvantages.

The Kunzler method, in particular the thin-drawing of a niobium tube filled with metal powder, is relatively complex. The wire manufactured according to this method must first be brought into its final configuration before the diffusion process can go forward. In many different applications, particularly with relatively large coils, this method is hampered by considerable difficulties. Changes in shape are not possible after annealing without exceedingly strong detraction from the superconductive properties of the wire.

The $Nb_3Sn$ layers deposited on the outer surfaces of bands or wires by diffusion or separation out of the gaseous phase must be extremely thin in order to be capable of elastic deformation. Inasmuch as the superconductive layers with such wires and bands are not situated at the neutral axis, there is the danger that during bending of the wires or bands these layers will crack or tear, and such failure in the continuity of the superconductive layers is particularly likely to occur during winding of the band or wire into a coil. Furthermore, these bands or wires must be electrically insulated one from the other inasmuch as the superconductive layers are situated at the exterior surfaces thereof.

A method has already been proposed for manufacturing superconductive bands with layers of superconductive two-component intermetallic compounds which avoid the above drawbacks of the known methods. In order to manufacture the superconductive bands with niobium-tin layers according to this proposed method, there is situated between a pair of niobium bands a smaller band of tin. The edges of the niobium bands are welded to each other, and the resulting band structure is subjected to a heat treatment during which the tin diffuses into the niobium and forms with the latter a layer of the superconductive intermetallic niobium-tin compound. Because of the welding of the edges of the outer niobium bands to each other, flowing of the tin out of the space between the bands during the heat treatment is avoided.

It is a primary object of my invention to provide a method of manufacturing superconductive bands having layers of the superconductive intermetallic niobium-tin compound ($Nb_3Sn$), which enables the manufacture of the band to be considerably simplified as compared to the known and proposed methods referred to above.

In particular it is an object of my invention to provide a method of manufacture which does not require the edges of a pair of outer bands to be welded to each other so as to prevent flowing of an interior layer of molten tin out of the space between the outer bands which are made of niobium.

It is also an object of my invention to provide for a pair of niobium bands with a layer of tin situated therebetween a structure which will maintain a predetermnied space between the niobium bands in which the layer of tin is located.

Furthermore, it is an object of my invention to provide a method which enables a superconductive band to be continuously manufactured.

Also, the objects of my invention include a superconductive band which is characterized by extremely great flexibility and bendability to a small radius without any danger of damaging the superconductive layers of the band.

Furthermore, it is an object of my invention to provide a structure which enables the band of my invention to be very efficiently manufactured.

According to my invention a layer of tin is situated between a pair of niobium bands, and the resulting assembly is heated to a temperature of approximately between 950° and 1200° C., so as to place the tin in a molten condition in which it diffuses into the niobium bands to react therewith so as to form the niobium-tin layers. In accordance with one of the important features of my invention during this heating of the niobium bands with the layer of tin therebetween, the distance between the pair of niobium bands is maintained small enough to retain the molten tin in the space between the niobium bands as a result of capillary action. Thus, in accordance with my invention, there is maintained between the niobium bands, during the heating thereof with the layer of tin situated therebetween, a constant space of less than 50$\mu$, so that as a result of the temporary action which is achieved in this way the molten tin is retained between the niobium bands.

Therefore, as contrasted with the above method according to which the edges of the niobium bands must be welded to each other, the method of my invention is of particular advantage inasmuch as the welding requirements are eliminated. Up to the present time, the welding of the edges of the outer niobium bands to each other has been considered essential, since it was anticipated that niobium was not wettable with tin and therefore there was a tendency for the molten tin to flow out of the gap between the niobium bands. However, tests have very convincingly demonstrated that technical niobium, irrespective of its surface properties, will be very effectively wetted by tin at temperatures of about 900° C. which are required to manufacture the niobium-tin layers. The wetting of the niobium by the tin is so good that the niobium can no longer be mechanically separated from the tin. By reason of this discovery, it is possible for the tin which becomes molten during the heating thereof when situated between the niobium bands to be retained in the gap between the niobium bands by capillary action, as long as during the heating there is maintained between the niobium bands a space whose size is chosen in such a way that capillary action will be achieved. When the space between the outer niobium bands is maintained at less than 50$\mu$, such capillary action is achieved. By reason of the capillary action none of the tin will flow out of the space between the bands, beyond the outer edges thereof, during the heating of the pair of niobium bands with the layer of tin therebetween, so that the welding of the band edges to each other is completely unnecessary. In order to obtain bands which are as thin as possible, the distance between the pair of niobium bands is preferably maintained between 5 and 10$\mu$.

In order to maintain this latter gap between the niobium bands during the heat treatment, various structures may be used. According to a preferred method of my invention, the tin band is situated between the niobium bands, but before it is placed between the niobium bands a thin wire is wound around the tin band so as to maintain the spacing between the niobium bands. This wire must be made of a material which will not form an alloy with the tin at the temperature at which the tin is rendered molten so as to form the desired niobium-tin layers. In particular a wire selected from the group consisting of tungsten or molybdenum and having a thickness on the order of 10$\mu$ is suitable for this purpose. As a result of the wire which is thus wound around the tin band, there will be a maintenance of a space between the niobium bands when the tin becomes molten.

The space between the niobium bands can also be maintained by crimping or bending the edges of the niobium bands upon themselves so as to form beaded band edges with the beaded edge of one niobium band engaging the other niobium band so as to define a predetermined gap between the niobium bands, or it is possible simply to form an elongated corrugation along each niobium band to engage the other niobium band. The use of wire for maintaining the space between the niobium bands is preferred, however, because of the particular simplicity of this method, and thus the use of a tin band with wire wound therearound is preferred to the use of niobium bands which have beaded edges or which are formed with corrugations.

In order to hold the niobium bands with the tin band therebetween together during the heating thereof, the assemblage of three bands is heated in a furnace in which a suitable guiding body, made for example of sintered alumina, guides the assembly of three bands through the furnace while at the same time suitable weights rest on the layers of niobium with the tin therebetween and act perpendicularly to the direction of movement of the bands for holding them together. The magnitude of the weights which can take the form of suitable carriages, for example, is such that the bands are not strongly pressed toward each other by the weight or carriage and instead the pressure with which the outer niobium bands are urged towards each other by the said weights is only sufficiently great to prevent an outward bulging of the niobium bands and avoid thus a change in the distance therebetween during the heating thereof.

In order to achieve with the finished superconductive band of my invention a very high current density, as is required in order to manufacture, for example, superconductive coils whose windings must achieve a high filling factor, which is to say must be capable of situating a large amount of windings in a small space, the initial material for the manufacture of the band of my invention is composed of bands which are as thin as possible. A lower limit for the thickness of the band is primarily determined only by the required strength of the band. Good results have been achieved with niobium and tin bands which are approximately 10$\mu$ thick, 3 mm. wide. If the width of the tin band, which is situated between the niobium bands, is smaller than that of the niobium bands, the width of the tin will increase when it is in its molten condition between niobium bands because of the wetting of the exterior surfaces thereof and the capillary action, so that as a result the thickness of the in layer which remains in the interior of the finished band after the heating thereof is additionally reduced. If with outer niobium bands of a width of 3 mm. a tin intermediate band of 1 mm. width and 10$\mu$ of thickness is used, then the thickness of the tin becomes reduced after it is rendered molten to a final tin layer having a thickness of approximately 3$\mu$.

During the heating, which is preferably carried out continuously in a tubular heater, the tin diffuses partially into the niobium bands and forms by reaction with the niobium cohesive layers of the intermetallic superconductive niobium-tin compound. To carry out this reaction the temperatures must range from approximately 950° to 12000 C. The thickness of the resulting niobium-tin layer depends upon the particular temperature which is used for heating and also upon the length of time during which the band structure is subjected to the heating. The layers become thicker as the temperature becomes higher, and as the duration of the heating becomes longer. In order to achieve a band of high flexibility, the niobium-tin layers should be as thin as possible. However, in order to achieve a high curent density, the niobium-tin layers should not be too thin. Bands which have niobium-tin layers of a thickness of 2$\mu$ have an extremely high degree of flexibility while also possessing a high current density. Because of the dependency of the thickness of the niobium-tin layer on the temperature and time of the heat treatment, it is possible to achieve a niobium-tin layer of a given thickness by different combinations of time and temperature according to which higher temperatures are combined with short times and lower temperatures are combined with longer times of the heat treatment. With a temperature of approximately 1000° C. the duration of the heating can range from 10 to 60 minutes, while at a temperature of 1100° C. the duration of the heating can range from 5 to 30 minutes, and at a temperature of 1200° C. a duration of 2.5–15 minutes will be satisfactory. During heating of the bands as they move continuously through a furnace, the duration of the heating is to be understood as that period of time during which a predetermined part of the band is situated in the furnace within a zone having the required temperature. The speed with which the band moves through the furnace during the heating thereof depends thus upon the selected temperature and the length of the furnace.

In order to prevent oxidizing or scaling-off or embrittlement of the bands during the heating, as a result of reacting with air, the heating is carried out in the presence of a protective gas, for example, in the presence of a stream of purified argon.

The superconductive band of my invention, which is manufactured according to the method of my invention, does not have the disadvantages of the known wires and bands which are manufactured according to previously known methods. With the band of my invention the superconductive layers are situated in the interior of the band close to the neutral axis thereof, so that during bending of the band the superconductive layers thereof are subjected only to an extremely small stress, and thus by suitable heating these superconductive layers can be made so thin that they are elastically deformable. Therefore, the band of my invention, after the heating thereof, which is to say after the formation of the superconductive layers, can be deformed without any further measures being required, so that it can immediately be wound into a suitable coil, for example. The outer enveloping material which is of normal conductivity gives the band a particularly high strength and can at the same time be used as an electrical insulating layer, when the band is superconducting.

My invention is illustrated by way of example in the accompanying drawings which form part of this application and in which.

Figure 1:
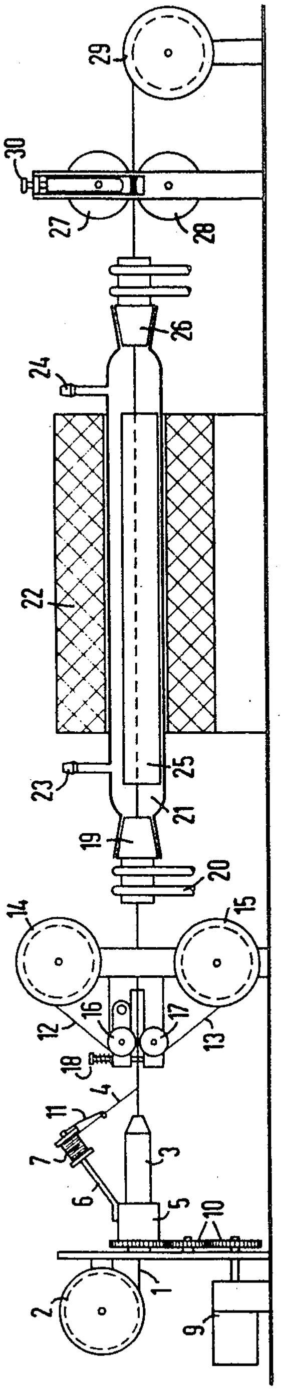
FIG. 1 is a schematic illustration of the method of my invention and an apparatus for practicing the method.

In the example which follows the manufacture of a superconductive band according to the method of my invention is described in connection with the apparatus shown in FIG. 1.

The initial material includes a pair of niobium bands and a tin band. Each of these bands has a thickness of $10\mu$ and a width of 3 mm. In order to maintain the capillary spacing between the niobium bands, a tungsten wire of a diameter of $10\mu$ is used. The initial material is mounted on the apparatus, in order to carry out the method of my invention, in the form of spools or rolls. During the manufacture of the superconductive band with the apparatus of FIG. 1, the tin band 1 is unwound from a roll 2 and initially is passed through a slot of a guide body 3. A tungsten wire 4 is wound around the tin band after it moves beyond the guide body 3. For this purpose a hollow rotary shaft 5 is carried by the guide body 3, and this rotary shaft fixedly carries a spindle 6 which carries a spool 7 of the tungsten wire. By means of the motor 9 and the gear transmission 10 the hollow shaft 5 is rotated about the guide body 3 so that the spool 7 moves around the tin band 1 along a circular path. The tungsten wire 4 is guided, during its unwinding from the spool 7, through a suitable guide element 11. The speed of rotation of the spool 7 about the tin band 1 is adapted to the speed of travel of the tin band in such a way that the convolutions of the tungsten wire on the tin band make an angle of approximately 45° with the longitudinal axis of the band. The tin band which is thus provided with a tungsten wire wound thereon is then brought between a pair of niobium bands 12 and 13 which are unwound from a pair of spools 14 and 15. The niobium bands are guided around a pair of brass rollers 16 and 17 which serve to press the niobium bands against the tin band, or more particularly against the tungsten wire 4 wound therearound. The pressure exerted by the brass rollers 16 and 17 can be regulated by way of an adjusting screw 18 provided with a spring whose compressive force can be adjusted by the screw 18. The pressure is adjusted in such a way that the pair of niobium bands have a sufficient frictional contact with the tin band, or the tungsten wire wound thereon, to guarantee that the tin band moves together with the pair of niobium bands while situated between the latter.

The band which in this way is made up of the three layers is introduced through a slot formed in a polished steel member 19 into an elongated heater or furnace so as to manufacture the niobium-tin layers therein. In order to avoid a premature melting of the tin, the ground steel member 19 is cooled by water flowing through copper coils 20. The elongated heater or furnace consists of a quartz tube 21 and a tubular furnace 22 surrounding the quartz tube 21. The tube 21 is provided with a pair of tubular extensions 23 and 24. Through these tubular extensions which communicate with the interior of the tube 21 argon, which has previously been purified, is directed through the tube 21 at approximately 1.1 atmospheres, and the direction of flow of the stream of purified argon is opposed to the direction of movement of the assembly of bands through the tubular heater. The argon acts as a protective gas and simultaneously prevents the entry of air through the narrow slots of the steel closure members at the ends of the quartz tube 21. A guide body 25 is situated in the interior of the quartz tube 21 in order to guide the bands therethrough, and for this purpose the guide body 25 is in the form of an elongated rod formed at an upper portion with a longitudinally exending groove in which the assembly of bands is situated during its movement through the heater. The guide body 25 preferably is in the form of a rod of sintered alumina. The band, composed of the three layers, is guided through the groove of the body 25 and during movement therethrough the band is loaded downwardly by suitable weights or carriages which are not illustrated in FIG. 1 but which may take the form of elongated members of sintered alumina, so that in this way the outward bulging or distortion of the niobium bands during the heating thereof are avoided. After the heating, the completed band is guided out of the heater through a slot of a polished steel closure member 26 which also is water cooled. The band then moves between a pair of motor-driven rubber rollers 27 and 28 and is coiled unto a take-up roll 29. The forward movement of the band through the apparatus is brought about solely by way of tension on the band, this pulling or tension on the band being derived from frictional engagement of the finished band with the motor-driven rubber rollers 27 and 28. The rollers, such as the rollers 16 and 17, which are situated in advance of the heater, are not driven. In this way distortion of the individual bands and unnecessary stressing thereof, which could result in tearing of the bands, are avoided. The pressure of the rubber rollers 27 and 28 on the band is adjusted by means of an adjusting screw 30.

The length of the tubular furnace with the apparatus described above so as to carry out the method of my invention is on the order of 600 mm. The bands are heated in the furnace up to a temperature approximately 1000° C. The length of the zone of the tubular heater in which the temperature of 1000° C. prevails, is on the order of 400 mm. At both ends of the furnace the temperature drops off. The bands are pulled through the heater at a speed of approximately from 1.5–2.5 cm. per minute. In this way niobium-tin layers having a thickness of approximately 2$\mu$ are achieved.

Figure 2:
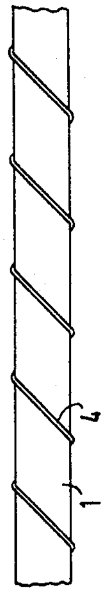
FIG. 2 is a fragmentary top plan view of a tin band having wire wound thereon before this band is placed between niobium bands.

In order to further illustrate the method of my invention, FIG. 2 shows a section of a tin band 1 having the tungsten wire 4 wound thereon. As is apparent from FIG. 2 the convolutions of the tungsten wire 4 form with the longitudinal axis of the band 1 and angle on the order of 45°.

Figure 3:
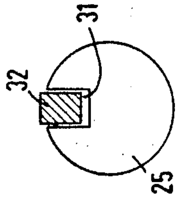
FIG. 3 shows in a transverse cross section one embodiment of a guiding body for guiding the bands during their movement through the heater.

FIG. 3 shows the guide body 25 in a transverse view. It is the groove which is formed in the upper portion of this body which serves to guide the assembly of three band layers therethrough. In the illustrated example used to carry out the method of my invention, the rod or body 25 has a length of approximately 800 mm. and is made of sintered alumina having a diameter of approximately 12 mm. This rod or sintered alumina is formed in an upper portion thereof with a longitudinally extending guide groove 31 of rectangular cross section. This groove has a width of 3.2 mm. and a depth of 4 mm. The 3 mm. wide bands slide, while being pulled through the heater, on the base of this groove 31 and with the above dimensions of the groove are effectively guided laterally thereby. In order to prevent distortion and upward bulging of the bands during the heating thereof, several bars 32 of sintered alumina having a width of 3.1 mm. and a thickness of 4 mm. as well as a length of 50 mm., are placed upon the assembly of bands which is situated in the groove 31. In the case where each of these bars 32 has a weight of 2.31 g., the bars 32 exert on the band assembly a pressure of 1.54 g./cm.$^2$. At this small pressure the forward movement of the band in the groove is not retarded.

Figure 4:
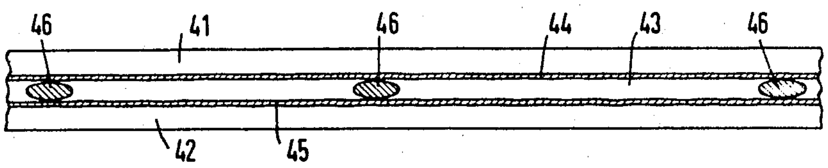
FIG. 4 is an elongated schematic illustration of a finished band of my invention which has been ground so as to clearly illustrate the interior structure thereof.

After leaving the furnace, the individual band layers are firmly united with each other. The total thickness of a band manufactured according to the above method of my invention using the initial material referred to above, is on the order of 34$\mu$. FIG. 4 shows a section of a finished band. This finished band section of FIG. 4 has been, however, longitudinally ground so as to render the interior structure thereof clearly visible. Between the pair of outer layers 41 and 42 of niobium and the intermediate layer 43 of tin, each of these layers 41–43 having a thickness on the order of 10$\mu$, are the niobium-tin layers 44 and 45 which resulted from the heat treatment and which have a thickness on the order of 2$\mu$, these layers 44 and 45 being clearly visible in FIG. 4. The ground sections 46 of the tungsten wire which was initially wound around the tin band to maintain the capillary spacing between the niobium bands are also visible in FIG. 4. The finished band of my invention has a very high degree of flexibility and can be elastically bent to a curved configuration having a radius of curvature of the order of 2.5–3.5 mm., and this bending can be achieved without providing any noticeable fissures or tiny cracks of any type in a photomicrograph of the niobium-tin layer.

The finished band of my invention is covered with a copper coating in order to manufacture a parallel resistance of normal conductivity and in order to protect the band against sudden jumps of the magnetic flux during use of the band in strong magnetic field where such sudden increases in the magnetic flux can occur. The cladding of the band in copper takes place preferably electrolytically. The copper layer has preferably a thickness of between 5 and 10 microns, which has proved to be satisfactory.

Figure 5:
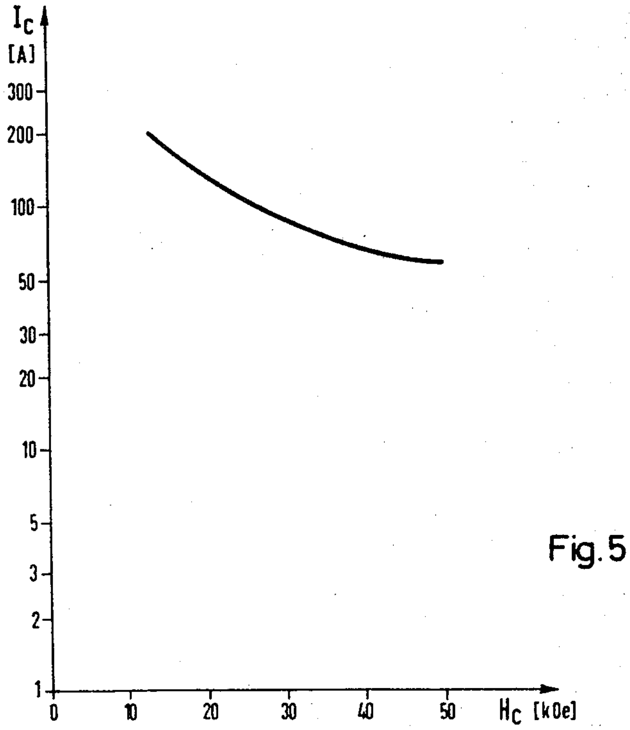
FIG. 5 shows the $I_C H_C$ curve of the band of FIG 4.

The superconductive bands manufactured according to my invention have outstanding electrical properties. They are capable of being loaded with very large currents even in very strong magnetic fields. FIG. 5 shows the so-called $I_CH_C$ curve of a superconductive band manufactured in the manner described above. This $I_CH_C$ curve is obtained by placing the superconductive band in magnetic fields of different strengths while loading the band with an electrical current to such an extent that the band moves from the superconducting state to the normal conducting state. The current intensity at which this transition occurs is indicated as the critical current intensity $I_C$. In FIG. 5 this critical current intensity $I_C$ is shown as the ordinate of the graph on a logarithmic scale. The magnetic field intensity is shown along the abscissa in kilooersteds in a linear scale. As may be seen from the curve of FIG. 5, the superconductive band of my invention which is manufactured according to the method of my invention can be loaded with a current on the order of 200 amperes in a magnetic field of approximately 13 kilooersteds and can be loaded with a current of approximately 58 amperes in a magnetic field of 50 kilooersteds. The band is 3 mm. wide and approximately 34 mm. thick. The two niobium-tin layers have a thickness of approximately 2$\mu$. The critical temperature of the band is on the order 17.4° K.

The method of my invention can be varied from the specific details referred to above. For example, the capillary space between the niobium bands, which is necessary in order to maintain the molten tin between the niobium bands due to capillary action, can also be maintained as by crimping the band edges so as to form them with beads. In this case the niobium bands must be guided in such a way that the beads at their edges become situated in the gap between the bands. The width of the tin band which is to be placed between such niobium bands will in this case of course be smaller than the width of the niobium bands.

Figure 6:
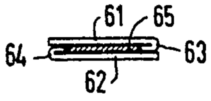
FIG. 6 shows in a transverse section another possible means, according to my invention, for maintaining the required capillary spacing between the niobium bands.

FIG. 6 shows in cross section a construction of this type. The niobium bands 61 and 62 have been crimped by having their edges 63 and 64 folded upon themselves, and the tin band 65 is shown situated between the beads formed by the crimped edges 63 and 64 of FIG. 6.

Figure 7:
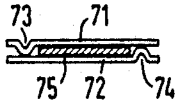
FIG. 7 shows in a transverse section yet another embodiment of a means for maintaining the capillary space between the outer niobium bands in accordance with my invention.

A further possibility for maintaining the capillary gap between the bands is shown in FIG. 7 where the constant spacing between the outer niobium bands is achieved by providing each of the bands 71 and 72 with a single elongated longitudinally extending corrugations 73 and 74, respectively, these corrugations being situated in the region of the edges of the bands. Thus, the corrugation 73 engages the band 72 and the corrugation 74 engages the band 71, and the tin band 75 is situated between the corrugations 73 and 74, as indicated in FIG. 7.

Furthermore, according to my invention the situation of the layer of tin between the niobium bands can be brought about by using a tin wire instead of a tin band. When the wire is brought to the molten condition it will spread out forming a molten layer of liquid tin throughout the space between the niobium bands.

The superconductive bands of my invention, achieved with the method and apparatus of my invention, are particularly suited, because of their high critical current intensities and high critical magnetic fields, as well as because of their outstanding flexibility, particularly for the manufacture of windings for superconductive coils. Also, they are suited for other purposes such as, for example, for the transmission of electrical current.

I claim:

1. In a method of manufacturing superconductive bands having layers of a superconductive intermetallic compound of niobium-tin ($Nb_3Sn$), the step of heating a pair of niobium bands with a layer of tin situated therebetween to a temperature between approximately 950° to 1200° C. to place the tin in molten condition while maintaining a distance of from 5 to 10$\mu$ between the niobium bands so that the molten tin does not flow out of the space between the niobium bands while at the same time reacting with and diffusing into the niobium bands to form layers of niobium-tin therewith.

2. In a method of manufacturing superconductive bands having layers of superconductive intermetallic compound of niobium-tin ($Nb_3Sn$), the step of heating a pair of niobium bands with a layer of tin situated therebetween to a temperature sufficiently high to place the tin in molten condition while maintaining a space between the layer of tin and the niobium bands by means of a thin wire which is wound around the layer of tin and which is made of a metal which does not alloy with the tin during the heating thereof to the molten condition, the niobium bands being separated by the wire wound tin layer a distance sufficiently small so that the molten tin is held between the niobium bands by capillary action while at the same time reacting with the niobium bands and diffusing therein to form layers of niobium-tin therewith.

3. The method according to claim 2, wherein the wire has a thickness of $10\mu$ and is selected from the group consisting of molybdenum and tungsten.

4. In a method of manufacturing superconductive bands having layers of superconductive intermetallic compound of niobium-tin ($Nb_3Sn$), the step of heating a pair of niobium bands having beaded edges engaging each other with a layer of tin situated between the bands to a temperature sufficiently high to place the tin in a molten condition while the beaded edges maintain a space for the molten tin between the bands sufficiently small so that the molten tin is held between the niobium bands by capillary action while at the same time reacting with and diffusing into the niobium bands to form layers of niobium-tin therewith.

5. In a method of manufacturing superconductive bands having layers of superconductive intermetallic compound of niobium-tin ($Nb_3Sn$), the step of heating a pair of niobium bands having longitudinal corrugations with a layer of tin situated between the bands to a temperature sufficiently high to place the tin in a molten condition while the longitudinal corrugations maintain a space for the molten tin between the bands sufficiently small so that the molten tin is held between the niobium bands by capillary action while at the same time reacting with and diffusing into the niobium bands to form layers of niobium-tin therewith.

6. In a method of manufacturing superconductive bands having layers of a superconductive intermetallic compound of niobium-tin ($Nb_3Sn$), the step of heating a pair of niobium bands with a layer of tin situated therebetween while longitudinally moving through a heating apparatus wherein the bands and layer of tin are guided in a groove of an elongated guiding body and while moving in the groove are weighted for urging the bands toward each other, the bands and layer of tin being heated to a temperature sufficiently high to place the tin in molten condition while maintaining a distance between the bands sufficiently small to hold the molten tin between the bands by capillary action while at the same time the molten tin reacts with and diffuses into the niobium bands to form layers of niobium-tin therewith.

7. The method according to claim 6, wherein the pair of niobium bands and the layer of tin situated therebetween are guided in a groove of a guiding body having the form of an elongated rod of sintered alumina.

References Cited

UNITED STATES PATENTS

| | | | |
|---|---|---|---|
| 2,451,099 | 10/1948 | La Motte | 29—501 X |
| 2,530,552 | 11/1950 | Stoddard | 29—501 X |
| 2,606,362 | 8/1952 | Martin et al. | 29—501 X |
| 3,144,370 | 8/1964 | Bennett et al. | 29—501 X |
| 3,181,936 | 5/1965 | Denny et al. | 29—599 |
| 3,209,449 | 10/1965 | Valentino et al. | 29—501 X |
| 3,218,693 | 11/1965 | Allen et al. | 29—599 |
| 3,352,008 | 11/1967 | Fairbanks | 29—501 X |

FOREIGN PATENTS

| | | |
|---|---|---|
| 1,352,545 | 1/1964 | France. |

PAUL M. COHEN, Primary Examiner

U.S. Cl. X.R.

29—194, 471.1, 501, 528